United States Patent
Price

[19]

[11] Patent Number: 5,900,768
[45] Date of Patent: May 4, 1999

| [54] | SYSTEM HAVING ACTIVE PULL-DOWN CIRCUIT AND METHOD |
|---|---|
| [75] | Inventor: Kyle J. Price, Woodlands, Tex. |
| [73] | Assignee: Compaq Computer Corp, Houston, Tex. |
| [ * ] | Notice: This patent is subject to a terminal disclaimer. |
| [21] | Appl. No.: 08/971,519 |
| [22] | Filed: Nov. 17, 1997 |

Related U.S. Application Data

[63] Continuation of application No. 08/609,341, Mar. 1, 1996, Pat. No. 5,805,014.

[51] Int. Cl.$^6$ .................................................. H03K 17/22
[52] U.S. Cl. ........................ 327/427; 327/430; 327/431; 327/309; 327/327
[58] Field of Search ........................................ 327/309, 313, 327/315, 318, 321, 327, 328, 331, 427, 430, 431, 432, 434, 437, 198, 143

[56] References Cited

U.S. PATENT DOCUMENTS

| 2,873,387 | 2/1959 | Kidd | 327/327 |
|---|---|---|---|
| 3,977,291 | 8/1976 | Southhard | 327/327 |
| 4,645,998 | 2/1987 | Shinohara et al. | 323/313 |
| 4,777,623 | 10/1988 | Shimazu et al. | 365/154 |
| 5,128,566 | 7/1992 | Killion et al. | 327/327 |
| 5,361,000 | 11/1994 | Koshikawa et al. | 327/530 |
| 5,412,333 | 5/1995 | Okunaga | 327/198 |
| 5,717,354 | 2/1998 | Kim et al. | 327/309 |
| 5,770,964 | 6/1998 | Suma | 327/327 |

*Primary Examiner*—Tuan T. Lam
*Attorney, Agent, or Firm*—Jenkens & Gilchrist

[57] ABSTRACT

The present invention relates to a circuit that pulls down the power supply line in an electronic system to a low state when the electronic system is turned off. More specifically, the present invention is an active circuit that establishes a low impedance between a power supply line and a return line when a system's power is turned off, and establishes a high impedance between a power supply line and a return line when the system is turned on.

18 Claims, 2 Drawing Sheets

SYSTEM HAVING ACTIVE PULL-DOWN CIRCUIT AND METHOD

This application is a continuation of application Ser. No. 08/609,341 filed on Mar. 1, 1996 now U.S. Pat. No. 5,805, 014.

BACKGROUND OF THE INVENTION

1. Field of the Invention

The present invention relates to a circuit that pulls down the power supply line (power rails) in an electronic system so that the power supply line goes to a low state and stays there when the electronic system is turned off. More specifically, the present invention relates to a circuit that pulls the power supply line low in a computer or other electronic system when the computer is turned off so that there is no residual voltage or back feed voltage on the power supply line when the system is turned off.

2. Description of Related Art

In the past when a power supply to a computer is turned off, the five volt power line was allowed to float at whatever voltage it naturally may have gone to. Most of the time the five volt power line would go to ground, unless an active peripheral device presents a bias to the power line through parasitic or "sneak" path. The active peripheral may thus cause the power line to be driven to a non-zero value. The non-zero voltage on the power line, which provides power to the various devices in a system, may cause system initialization problems when the system is turned on. Examples of system initialization problems include unrecognizable or inoperable system functions. A real life example could be a peripheral system, such as a mouse driver or networked interface cards, may not initialize correctly.

To remedy the residual voltage on the power line problem a passive technique has been used. FIG. 1 depicts an example of the passive technique. The passive technique requires a resistance, Rb, to be placed between power and ground. The passive technique corrects most of the problems of residual voltage on the power line when the system is turned off depending on the resistance value and the amount of current available from the biasing source. There are also drawbacks to the passive technique.

The drawbacks of the passive technique for pulling the power line low when the system is off include a decrease in the efficiency of the total system because when the system is on there is a resistor connected between the power line and ground consuming energy and doing basically nothing As a result, the power consumption of the system increases and the efficient use of energy decreases This is a significant drawback when complying with "Energy Star" requirements.

Thus, there is a need for a circuit that pulls a power supply's lines low or to ground when a computer or an electronic system is turned off, but dissipates no or an insignificant amount of power when the system is turned on. The present invention will accomplish both of these objectives

SUMMARY OF THE INVENTION

The present invention provides a low impedance path from a power supply line to a ground (return) line when the power supply is turned off. In addition, the circuit draws minimal power when the power supply is on, thereby maintaining the efficiency of the power supply.

The present invention can be implemented in at least one of three configurations One utilizes an N-channel depletion mode MOSFET, two bias resistors and a current limiting resistor A second implementation uses an N-channel depletion mode JFET, two bias resistors and a current limiting resistor Both of these first two implementations derives a gate bias voltage from a negative voltage source A third possible configuration uses a P-channel depletion mode JFET, two bias resistors and a current limiting resistor. This third implementation derives a gate bias voltage from a positive voltage line.

BRIEF DESCRIPTION OF THE DRAWINGS

Other objects, features, and characteristics of the present invention as well as methods of operation and functions of the related elements of structure, and the combination of parts and economies of manufacture, will become more apparent upon consideration of the following description and the appended claims with reference to the accompanying drawings, all of which form a part of this specification, and wherein:

DETAILED DESCRIPTION OF A PRESENTLY PREFERRED EXEMPLARY EMBODIMENT

When an electronic system is powered down, residual voltage may still be found on the power bus. By pulling the power bus or line to a low or ground when an electronic system, such as a computers is turned off, it removes the possibility of a power-up failure when peripherals 610 (FIG. 6) are left on after turning off the computer. The non-zero voltage impressed on the power lines by a connected, powered peripheral 610 can lead to the electronic device having initialization problems when system power is re-applied. Initialization problems may lead to improper system operation.

Figure 1:
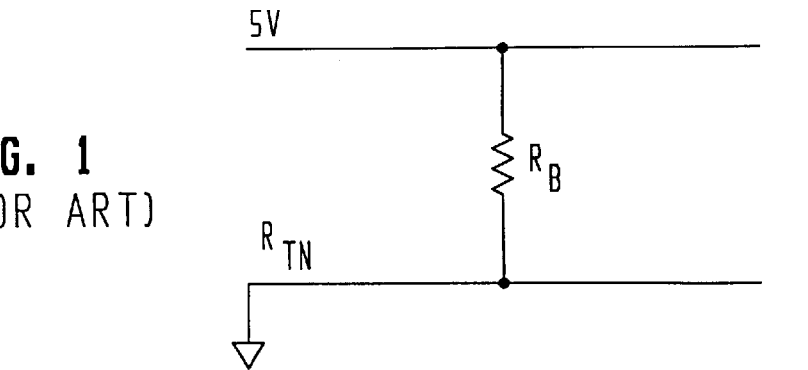
FIG. 1 depicts a passive technique for pulling down a power line.
Figure 2:
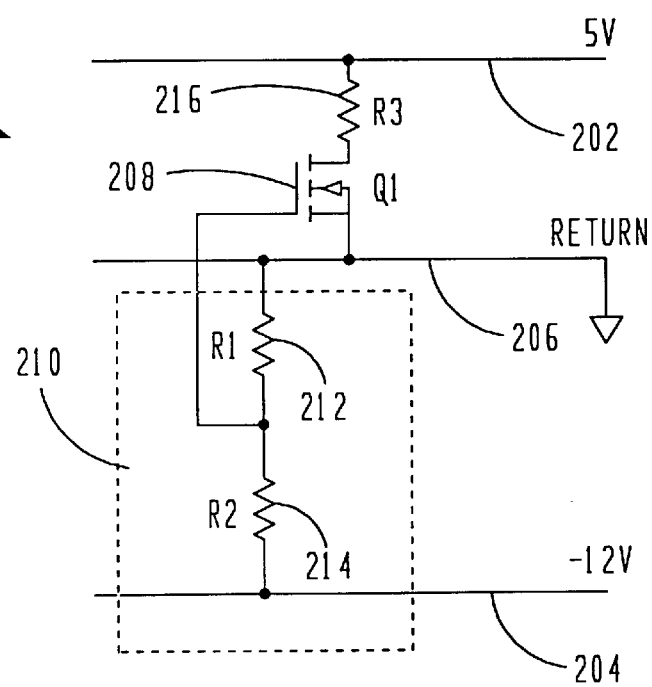
FIG. 2 depicts a first embodiment of an active pull-down circuit.

FIG. 2 depicts a first embodiment of an active pull-down circuit 200 in accordance with the present invention. The active pull-down circuit 200 is connected to a power line 202, which in the FIG. 2 is shown as a five volt (5 V) line. There is also a low voltage line 204, which in this embodiment is shown as minus twelve volts (−12 V). A ground or return line 206 is also shown. An N-channel depletion mode MOSFET transistor 208 is connected between the power line 202 and the return line 206 such that the source of the transistor 208 is connected to the ground line 206 and the drain of the transistor 208 is connected to the power line 202.

The gate of transistor 208 is connected to a voltage divider circuit 210, which is comprised of resistors R1 and R2 (212, 214). There also may be an optional resistance R3 216 between the power line 202 and the return line 2060 Resistor R3 is shown in the depicted embodiment to be between the drain of transistor 208 and the power line 202, but could also be place between the source of transistor 208 and the return line 206. This resistance may be used to limit the current through the transistor 208 when it is turned on.

Furthermore, the voltage divide circuit 210 is not limited to comprising two fixed resistors, but could comprise a potentiometer of various kinds including programmable potentiometers, mechanically variable potentiometers, etc, or a voltage divider circuit made of components other than resistors such as transistors configured in a voltage division design. The voltage divider circuit 210 could also be a single resistor that provides a voltage drop.

The voltage divider circuit 210 is used to divide the voltage that may be seen by the gate of transistor 208 to a voltage low enough so that the maximum gate voltage is not exceeded.

The transistor 208 is preferably an N-channel depletion mode MOSFET in this embodiment, but could be any reasonably equivalent transistor. The attribute of using the N-channel depletion mode transistor is that when there is no gate voltage relative to the source (i.e. when the power is turned off), the transistor 208 provides a very low impedance between the power line 202 and the return line 206. Thus, any devices that are connected to the power line and that could be back driving the power line 202 will be pulled to ground.

When the power supply is turned back on, resistors R1 and R2 (212, 214) divide the low voltage line 204, for example −12v, with respect to the return line 206 thereby creating a predetermined gate voltage (bias) on the transistor 208. The transistor 208 will turn on and create a high impedance between the power line 202 and the return line 206 thereby not pulling the power line 202 down to or near to the voltage of the return line.

For this embodiment to operate correctly the power line voltage must be greater than the return line voltage, and the return line voltage must be greater than the low voltage line voltage.

Figure 3:
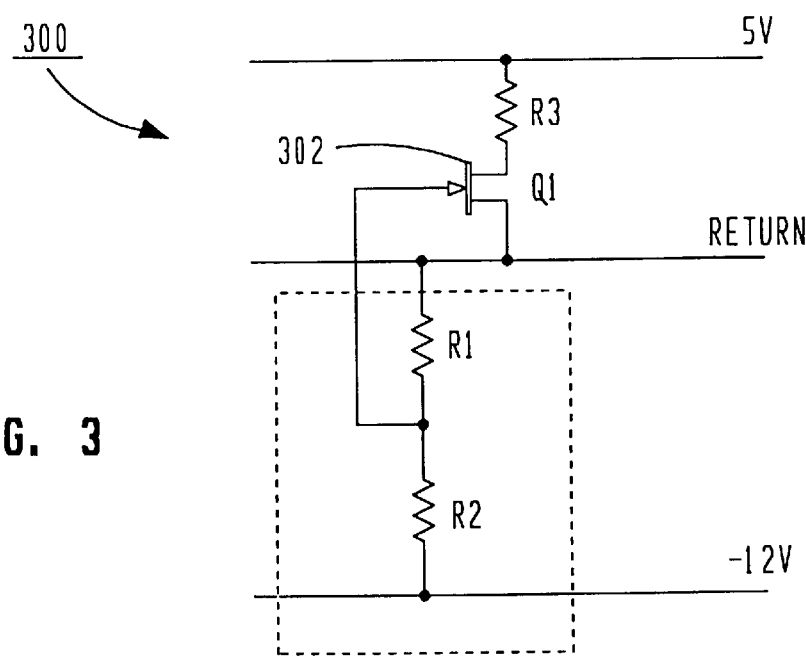
FIG. 3 depicts a second embodiment of an active pull-down circuit.

Referring now to FIG. 3, a second embodiment of an active pull-down circuit 300 of the present invention is depicted The second embodiment is similar to the first embodiment except the transistor 302 is an N-channel depletion mode JFET. A JFET is a slightly different device than the MOSFET depicted in FIG. 2, but it functions in a substantially similar manner. The transistor 302 has different threshold voltages and provides a slightly higher channel resistance than the transistor 208, but still meets the needs of the present invention.

Furthermore, with the transistor 302 installed in the second embodiment of the present invention it is possible to design the circuit so that R2 is not required in the voltage divider circuit 308.

The JFET configuration, from a production perspective, is a less expensive configuration and the MOSFET configuration, but from an engineering standpoint the MOSFET configuration is the better of the two.

Figure 4:
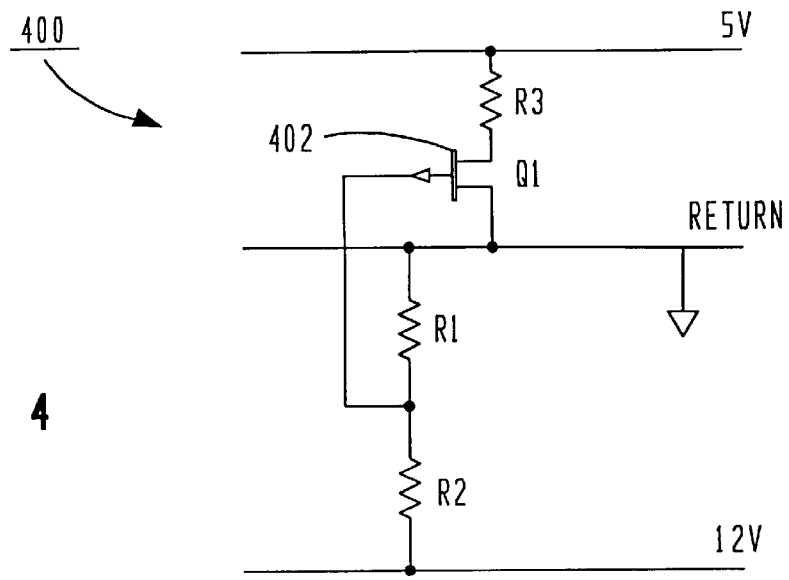
FIG. 4 depicts a third embodiment of an active pull-down circuit.

FIG. 4 depicts a third embodiment of an active pull-down circuit 400 of the present invention wherein the transistor 402 is preferably a P-channel depletion mode JFET. This embodiment operates similarly to the first and second embodiments except that the low voltage line of the first and second embodiments is a high voltage line 404. That is, the high voltage line must be at a higher voltage than the voltage of the return voltage line.

Figure 5:
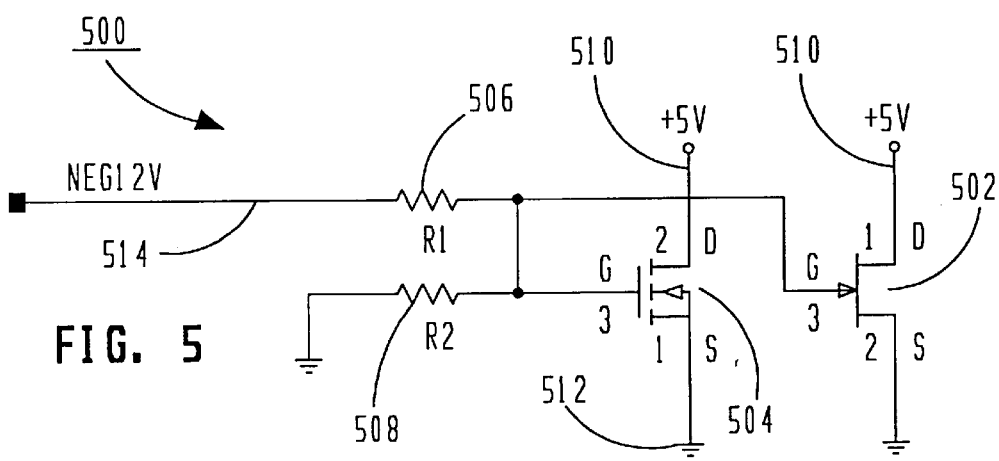
FIG. 5 depicts a fourth embodiment of an active pull-down circuit.

FIG. 5 depicts a fourth embodiment of the present invention. FIG. 5 depicts schematic of a voltage pull down circuit that can utilize either an n-channel depletion mode MOS-FET transistor 504 or an n-channel depletion mode JFET transistor 502 only one of the transistors 502, 504 is required in the circuit. Note that the gates of both transistors 502, 504 are connected to the same node. This configuration allows manufacturing to install the transistor that is in supply at the time.

Resistors R1, and R2 506, 508 are used in a voltage divider portion of the active pull down circuit. As with the previous embodiments, there is a power line 510, a return line 512, and a low voltage line 514. In the preferred embodiment the power line 510 is five volts (5 V) when the system is on; the return line 512 is ground, and the low voltage line 514 is minus twelve volts (−12 V).

It is noted that if the JFET transistor 502 is used in this embodiment, then only one resistor, resistor R1 506, is required in the voltage divider circuit.

When turning on the power to the present active pull down circuit, it is preferred that the low voltage line be energized just prior to powering the power line. That is; the sequence of powering up the computer or electronic device should be to power the low voltage line just prior to powering the power line. The reason for this power-on sequence is that if the power line came on first, then the active pull down circuit would attempt to pull down the power line until the low voltage line was turned on. In such a situation the active pull down circuit may not be able to handle the current flow of the energized power line while attempting to pull it down. It is understood that it is preferred that the low voltage line be turned on first, but the circuit can also work with substantial competency if both voltages are turned on at substantially the same time.

On power down, it is preferred that the power line is turned off just prior to the low voltage line, but the system will operate well if both are turned off (powered down) at substantially the same time. The circuit is not designed to work when the low voltage line is powered down while the power line is energized The present invention accomplishes a variety of objectives First, it provides a low impedance path from a power line to a return (ground) line when a system, such as a computer is powered off. Second, the present invention provides a minimal current draw from the power line when the system is on. Third, the present invention provides a single point to remove unwanted voltage from the power line when a system is off.

Figure 6:
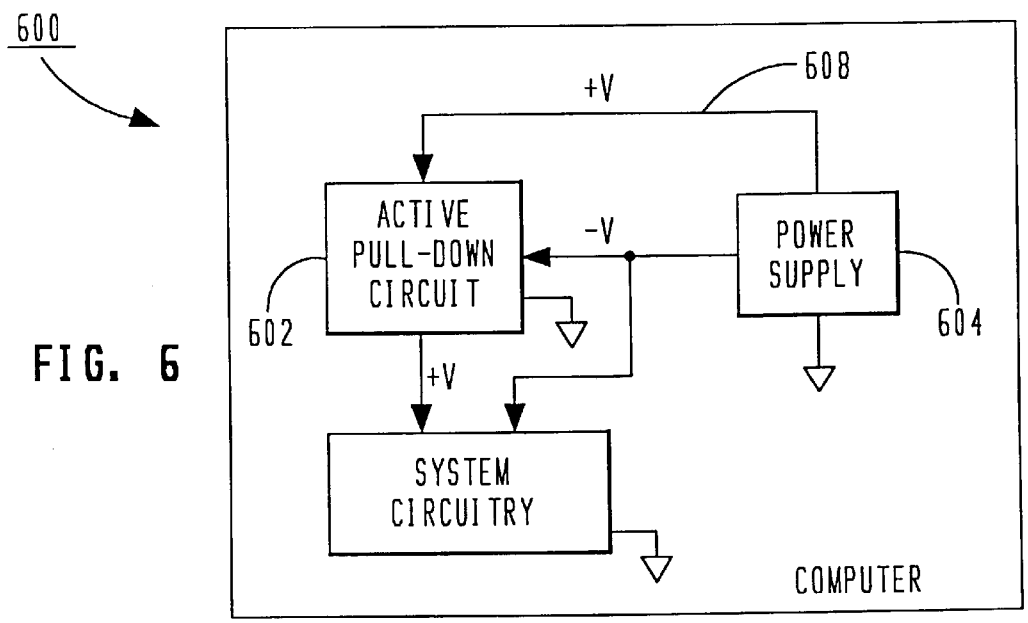
FIG. 6 depicts an exemplary system that incorporates an embodiment of the present active pull-down circuit.

FIG. 6 depicts an embodiment of the present invention operating within an electronic system 600, preferably a computer system It is noted that the active pull-down circuit 602 could be incorporated into the power supply 604 of an electronic system or into the circuitry 606 of the electronic device/system 600. The active pull down circuit 602 pulls down the +V line 608 to ground when the power supply 604 is turned off. The active pull down circuit 602 provides a high impedance between the +V line 608 and ground when the power supply 604 is turned on.

Although a few preferred embodiments of the invention have been shown and described, it will be appreciated by those skilled in the art that changes may be made in these embodiments without departing from the principles and the spirit of the invention, the scope of which is defined in the appended claims.

What is claimed is:

1. A computer system comprising:
   a power supply having a power line and a return line;
   a peripheral device electrically connected to said power line; and a circuit for pulling down said power line when said power supply is turned off connected to said power supply, said circuit providing a high impedance between said power line and said return line when said power supply is on and providing a low impedance between said power line and said return line when said power supply is off.

2. The computer system of claim 1, wherein said circuit comprises:

a transistor having a source connected to said return line and a drain connected to said power line; and voltage-dividing means for dividing down a voltage connected between said return line and a voltage line, wherein said voltage-dividing means is coupled to a gate terminal associated with said transistor.

3. The computer system of claim 2, wherein said voltage-dividing means for dividing down said voltage provides a gate voltage to said transistor.

4. The computer system of claim 2, wherein said transistor is at least one of a JFET and a MOSFET transistor.

5. The computer system of claim 2, wherein said transistor is an n-channel depletion mode transistor.

6. The computer system of claim 1, wherein said circuit comprises:

a transistor having a drain connected to said return line and a source connected to said power line; and means for dividing down a voltage connected between said return line and a voltage line, wherein said means for dividing is coupled to a gate terminal associated with said transistor.

7. The computer system of claim 6, wherein said transistor is a p-channel depletion mode transistor.

8. A computer having an active pull-down circuit which pulls a first voltage line down when a power supply is not providing power to the first voltage line comprising:

a transistor, including at least a gate, said transistor connected between said first voltage line and a second voltage line;

a peripheral device electrically connected to said first voltage line; and means for providing a bias voltage to said gate of said transistor, said providing means being connected at least between said second voltage line and a third voltage line, wherein said transistor establishes a high impedance between said first voltage line and said second voltage line when said bias voltage comprising a first value is provided to said gate of said transistor and said transistor establishes a low impedance between said first voltage line and said second voltage line when said bias voltage comprising a second value is provided to said gate of said transistor.

9. The computer having the active pull-down circuit of claim 8, wherein said means for providing said bias voltage comprises at least one resistor.

10. The computer having the active pull-down circuit of claim 8, wherein said means for providing said bias voltage comprises a voltage divider circuit.

11. The computer having the active pull-down circuit of claim 8, wherein said transistor is a NOSFET.

12. The computer having the active pull-down circuit of claim 8, wherein said transistor is a JFET.

13. The computer having the active pull-down circuit of claim 8, wherein said transistor is an N-channel depletion mode transistor.

14. The computer having the active pull-down circuit of claim 8, wherein said transistor is a P-channel depletion mode transistor.

15. A computer system comprising:

a peripheral device;

a power source for providing power to said peripheral device, said power source having a power line and a ground line; and a circuit for actively pulling down said power line when said power source is not providing power to said power line, said circuit comprising a transistor electrically connected between said power line and said ground line, said circuit further comprising means for providing a bias voltage to a gate of said transistor, said circuit at least for pulling the voltage on said power line to said ground line when said power source is not providing power to said peripheral.

16. The computer system of claim 15, wherein said circuit provides a low impedance between said power line and said ground line when said power source is not providing power to said peripheral.

17. The computer system of claim 15, wherein said circuit provides a high impedance between said power line and said ground line when said power source provides power to said peripheral.

18. The computer system of claim 15, wherein said means for providing a bias voltage is a voltage divider circuit.

* * * * *

UNITED STATES PATENT AND TRADEMARK OFFICE
CERTIFICATE OF CORRECTION

PATENT NO : 5,900,768
DATED : May 4, 1999
INVENTOR(S): Kyle J. Price

It is certified that error appears in the above-identified patent and that said Letters Patent is hereby corrected as shown below:

Column 2, line 42    Replace "computers"
                     With --computer,--

Column 2, line 64    Replace "2060"
                     With --206.--

Column 4, line 2     Replace "502 only"
                     With --502. Only--

Column 6, line 13    Replace "NOSFET"
                     With --MOSFET--

Signed and Sealed this

Eleventh Day of April, 2000

Attest:

Q. TODD DICKINSON

*Attesting Officer*    *Director of Patents and Trademarks*